(12) United States Patent
Kang et al.

(10) Patent No.: US 7,816,735 B2
(45) Date of Patent: Oct. 19, 2010

(54) INTEGRATED CIRCUIT DEVICES INCLUDING A TRANSCRIPTION-PREVENTING PATTERN

(75) Inventors: Pil-Kyu Kang, Seoul (KR); Yong-Hoon Son, Gyeonggi-do (KR); Si-Young Choi, Geonggi-do (KR); Jong-Wook Lee, Gyeonggi-do (KR); Byeong-Chan Lee, Gyeonggi-do (KR); InSoo Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 271 days.

(21) Appl. No.: 11/974,293

(22) Filed: Oct. 12, 2007

(65) Prior Publication Data

US 2008/0093601 A1 Apr. 24, 2008

(30) Foreign Application Priority Data

Oct. 13, 2006 (KR) ............... 10-2006-0099728
Jan. 25, 2007 (KR) ............... 10-2007-0007779

(51) Int. Cl.
H01L 33/16 (2010.01)
(52) U.S. Cl. ............... 257/347; 257/349; 257/350; 257/354; 257/E29.117; 257/E29.273; 257/E29.286
(58) Field of Classification Search .......... None
See application file for complete search history.

(56) References Cited

U.S. PATENT DOCUMENTS 6,882,010 B2 4/2005 Bhattacharyya ............ 257/350
2005/0277235 A1* 12/2005 Son et al. ................... 438/166
2006/0237725 A1* 10/2006 Jeong et al. ................. 257/66

FOREIGN PATENT DOCUMENTS

| KR | 1020010064119 | 7/2001 |
|---|---|---|
| KR | 0418089 | 1/2004 |
| KR | 464296 | 12/2004 |
| KR | 1020050112458 | 11/2005 |
| KR | 612892 | 8/2006 |

* cited by examiner

Primary Examiner—Minh-Loan T Tran
Assistant Examiner—Fei Fei Yeung Lopez
(74) Attorney, Agent, or Firm—Myers Bigel Sibley & Sajovec

(57) ABSTRACT

Integrated circuit devices are provided including a first single-crystalline layer and an insulating layer pattern on the first single-crystalline layer. The insulating layer pattern has an opening therein that partially exposes the first single-crystalline layer. A seed layer is in the opening. A second single-crystalline layer is on the insulating layer pattern and the seed layer. The second single-crystalline layer has a crystalline structure substantially the same as that of the seed layer. A transcription-preventing pattern is on the second single-crystalline layer and a third single-crystalline layer on the transcription-preventing pattern and the second single-crystalline layer. The transcription-preventing pattern is configured to limit transcription of defective portions in the second single-crystalline layer into the third single-crystalline layer.

10 Claims, 11 Drawing Sheets

US 7,816,735 B2

INTEGRATED CIRCUIT DEVICES INCLUDING A TRANSCRIPTION-PREVENTING PATTERN

CROSS-REFERENCE TO RELATED APPLICATIONS

This application is related to and claims priority under 35 USC §119 from both Korean Patent Application No. 2006-99728, filed on Oct. 13, 2006, and Korean Patent Application No. 2007-7779, filed on Jan. 25, 2007, in the Korean Intellectual Property Office (KIPO), the disclosures of which are herein incorporated by reference herein in their entireties.

BACKGROUND OF THE INVENTION

The present invention relates to a integrated circuit devices and a methods of manufacturing the same. More particularly, the present invention relates to integrated circuit devices having a stack structure and methods of manufacturing the same.

Generally, a material may be classified as a single-crystalline material, a polycrystalline material or an amorphous crystalline material based on the crystalline structure of the material. The single-crystalline material has one crystalline structure, the polycrystalline material has a plurality of crystalline structures, and the amorphous crystalline material has a structure having an irregular atom arrangement. As the polycrystalline material has a plurality of crystalline structures, the polycrystalline material may have many grain boundaries. When there are a large number of grain boundaries, carriers, such as electrons or holes, generally cannot move easily and cannot be efficiently controlled.

In manufacturing a system-on-chip (SOC) device or a semiconductor (integrated circuit) device that includes a thin-film transistor (TFT) having a stack structure, the single-crystalline silicon material is widely used as a layer for an active region.

A method of forming the single-crystalline layer will now be described. An insulating layer pattern having an opening is formed on a single-crystalline silicon substrate. A seed layer having a single-crystalline structure is formed in the opening by a selective epitaxial growth (SEG) process. A first amorphous crystalline silicon layer is formed on the insulating layer pattern including the seed layer. A laser beam is then used to irradiate the first amorphous crystalline silicon layer. As a result, the first amorphous crystalline silicon layer is changed into a first single-crystalline silicon layer by a phase change of the first amorphous crystalline silicon layer.

However, when the first single-crystalline silicon layer is formed by the above-mentioned method, as shown FIGS. 1A and 1B, defective portions may be formed in the first single-crystalline silicon layer. For example, when a laser-induced epitaxial growth (LEG) process is performed, defective portions having a protruded shape are typically formed.

When a second amorphous crystalline silicon layer on the first single-crystalline silicon layer having the defective portions is phase-changed by laser irradiation, the defective portions of the first single-crystalline silicon layer may be transcribed into the second amorphous crystalline silicon layer. As a result, a shape corresponding to a shape of the defective portions may be formed in the second single-crystalline silicon layer. Accordingly, when the defective portions are formed in the second single-crystalline silicon layer, the electrical reliability of the semiconductor device may be deteriorated.

As described above, a single-crystalline silicon layer formed by a conventional method may have deteriorated electrical characteristics due to the defective portions.

SUMMARY OF THE INVENTION

In some embodiments of the present invention, integrated circuit devices are provided including a first single-crystalline layer and an insulating layer pattern on the first single-crystalline layer. The insulating layer pattern has an opening therein that partially exposes the first single-crystalline layer. A seed layer is in the opening. A second single-crystalline layer is on the insulating layer pattern and the seed layer. The second single-crystalline layer has a crystalline structure substantially the same as that of the seed layer. A transcription-preventing pattern is on the second single-crystalline layer and a third single-crystalline layer on the transcription-preventing pattern and the second single-crystalline layer. The transcription-preventing pattern is configured to limit transcription of defective portions in the second single-crystalline layer into the third single-crystalline layer.

In other embodiments, the seed layer fills the opening and has a crystalline structure substantially the same as that of the first single-crystalline layer. The transcription-preventing pattern is configured to prevent defective portions in the second single-crystalline layer from being transcribed into overlying layers. The transcription-preventing pattern may be an oxide and/or a nitride. The transcription-preventing pattern may cover the defective portions. The third single-crystalline layer may have a thickness greater than a thickness of the second single-crystalline layer.

In further embodiments, the integrated circuit devices further include a gate pattern on the third single-crystalline layer and source/drain regions in the third single-crystalline layer that extend under sidewalls of the gate pattern. The transcription-preventing pattern may be positioned adjacent the source/drain regions to limit leakage current from the source/drain regions. An isolation layer may be provided on the second single-crystalline layer, wherein the isolation layer has a thickness greater than a thickness of the transcription-preventing pattern.

In other embodiments, the insulating layer pattern has a plurality of openings therein that partially expose the first single-crystalline layer and the transcription-preventing pattern covers portions of the second single-crystalline layer substantially at a midpoint between respective ones of the plurality of openings. The defective portions comprise a meeting point of growth fronts that formed the second single-crystalline layer.

In yet other embodiments, methods of manufacturing an integrated circuit device include forming an insulating layer pattern on a first single-crystalline layer, the insulating layer pattern having an opening that partially exposes the first single-crystalline layer. A seed layer is formed in the opening. A first amorphous crystalline layer is formed on the insulating layer pattern and the seed layer. The first amorphous crystalline layer is transformed into a second single-crystalline layer by laser annealing, the second single-crystalline layer having a crystalline structure substantially the same as that of the seed layer. A transcription-preventing pattern is formed on the second single-crystalline layer, the transcription-preventing pattern being configured to limit transcription of defective portions in the second single-crystalline layer into an overlying layer of the integrated circuit device. A second amorphous crystalline layer is formed on the transcription-preventing pattern and the second single-crystalline layer. The second amorphous crystalline layer is transformed into a third single-crystalline layer by laser annealing, the third single-crystalline layer having a crystalline structure substantially the same as that of the second single-crystalline layer.

In other embodiments, forming the seed layer includes filling the opening with the seed layer, the seed layer having a crystalline structure substantially the same as that of the first single-crystalline layer. Forming the transcription-preventing pattern may include forming the transcription-preventing pattern covering the defective portions. Third single-crystalline layer may be formed to have a thickness greater than that of the second single-crystalline layer.

In further embodiments, the method further includes forming a gate pattern on the third single-crystalline layer and forming source/drain regions in the third single-crystalline layer that extend under and contact the sidewalls of the gate pattern. The transcription-preventing pattern may be formed adjacent to the source/drain regions. An isolation layer may be formed on the second single-crystalline layer, wherein the isolation layer is formed to have a thickness greater than that of the transcription-preventing pattern.

In other embodiments, forming the transcription-preventing layer and forming the isolation layer include concurrently forming the transcription-preventing layer and the isolation layer using a laser induced epitaxial growth (LEG) process. Forming the seed layer and forming the first amorphous crystalline layer may include forming the layers using an epitaxial growth process. Forming the transcription-preventing layer and forming the second amorphous crystalline layer may include forming the transcription-preventing layer and forming the second amorphous crystalline layer in a same chamber.

In yet further embodiments, semiconductor devices include a first single-crystalline layer and a first insulating layer pattern on the first single-crystalline layer, the first insulating layer pattern having an opening partially exposing the first single-crystalline layer. A first seed layer fills the opening, the seed layer having a crystalline structure substantially the same as that of the first single-crystalline layer. A second single-crystalline layer is on the first insulating layer pattern and the seed layer, the second single-crystalline layer having a crystalline structure substantially the same as that of the first seed layer. A third single-crystalline layer is arranged over the second single-crystalline layer and a first transcription-preventing layer is interposed between the second single-crystalline layer and the third single-crystalline layer that prevents defective portions in the second single-crystalline layer from being transcribed into the third single-crystalline layer.

In other embodiments, the first transcription-preventing layer is silicon germanium, silicon carbide and/or silicon germanium carbon. The devices may further include a second insulating layer to an m-th insulating layer, a second seed layer to an m-th seed layer, wherein m is a natural number no less than 3, a fourth single-crystalline layer to an n-th single-crystalline layer, wherein n is an even number no less than 6, a second transcription-preventing layer to an o-th transcription-preventing layer, wherein o is a natural number no less than 3, a fifth crystalline layer to a p-th crystalline layer, wherein p is an odd number no less than 7, sequentially and repeatedly formed on the third single-crystalline layer. The second insulating layer to the m-th insulating layer are substantially the same as the first insulating layer, the second seed layer to the m-th seed layer are substantially the same as the first seed layer, the fourth single-crystalline layer to the n-th single-crystalline layer are substantially the same as the second single-crystalline layer, the second transcription-preventing layer to the o-th transcription-preventing layer are substantially the same as the first transcription-preventing layer, and the fifth crystalline layer to the p-th crystalline layer are substantially the same as the third single-crystalline layer.

In further embodiments, the second transcription-preventing layer to the o-th transcription-preventing layer are silicon germanium, silicon carbide and/or silicon germanium carbon. Each of the fifth crystalline layer to the p-th crystalline layer may have a thickness greater than that of the fourth single-crystalline layer to the n-th single-crystalline layer.

In yet other embodiments, methods of manufacturing a semiconductor device include forming a first insulating layer pattern on a first single-crystalline layer, the first insulating layer pattern having an opening partially exposing the first single-crystalline layer. The opening is filled with a first seed layer, the first seed layer having a structure substantially the same as that of the first single-crystalline layer. An amorphous crystalline layer is formed on the first insulating layer pattern and the first seed layer. The amorphous crystalline layer is transformed into a second single-crystalline layer by irradiating a laser beam onto the amorphous crystalline layer, the second single-crystalline layer having a crystalline structure substantially the same as that of the first seed layer. A first transcription-preventing layer is formed on the second single-crystalline layer, the first transcription-preventing layer preventing defective portions in the second single-crystalline layer from being transcribed into an upper layer. A third single-crystalline layer is formed on the first transcription-preventing layer.

In further embodiments, the methods further include sequentially and repeatedly forming a second insulating layer to an m-th insulating layer, a second seed layer to an m-th seed layer, wherein m is a natural number no less than 3, a fourth single-crystalline layer to an n-th single-crystalline layer, wherein n is an even number no less than 6, a second transcription-preventing layer to an o-th transcription-preventing layer, wherein o is a natural number no less than 3, a fifth crystalline layer to a p-th crystalline layer, wherein p is an odd number no less than 7, on the third single-crystalline layer. The second insulating layer to the m-th insulating layer are substantially the same as the first insulating layer, the second seed layer to the m-th seed layer are substantially the same as the first seed layer, the fourth single-crystalline layer to the n-th single-crystalline layer are substantially the same as the second single-crystalline layer, the second transcription-preventing layer to the o-th transcription-preventing layer are substantially the same as the first transcription-preventing layer, and the fifth crystalline layer to the p-th crystalline layer are substantially the same as the third single-crystalline layer.

BRIEF DESCRIPTION OF THE DRAWINGS

The above and other features and advantages of the present invention will become readily apparent by reference to the following detailed description when considered in conjunction with the accompanying drawings wherein:

FIGS. 4A through 4I are cross-sectional views illustrating a method of manufacturing the semiconductor device of FIG. 2 in accordance with some embodiments of the present invention;

DESCRIPTION OF THE EMBODIMENTS

Figure 1A:
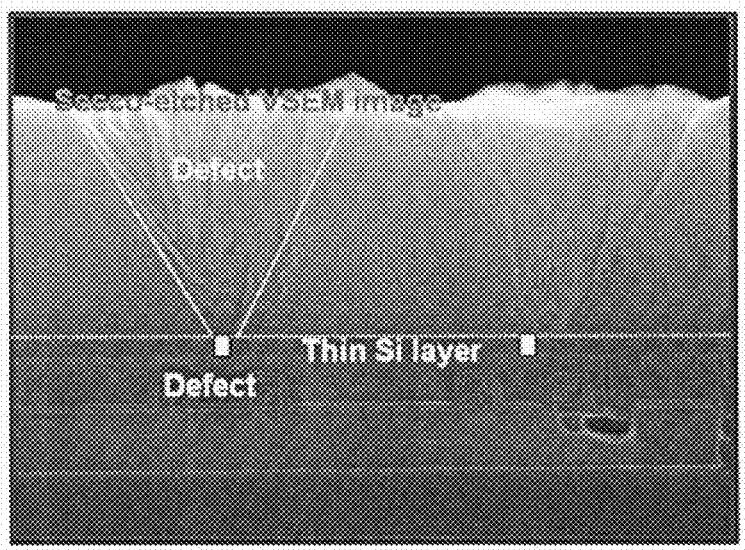
FIGS. 1A and 1B are scanning electron microscope (SEM) pictures showing disadvantages of a thin layer including a single-crystalline structure formed by a conventional method.
Figure 1B:
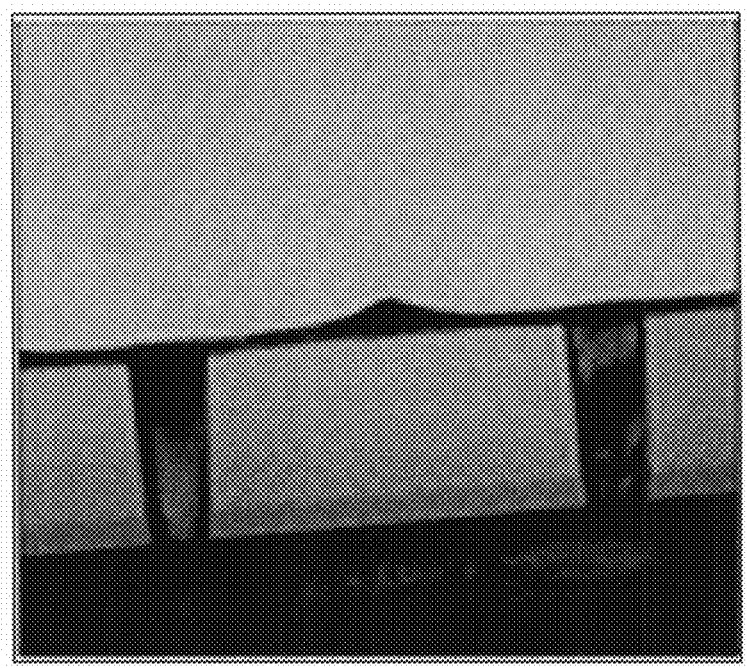

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on, connected or coupled to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
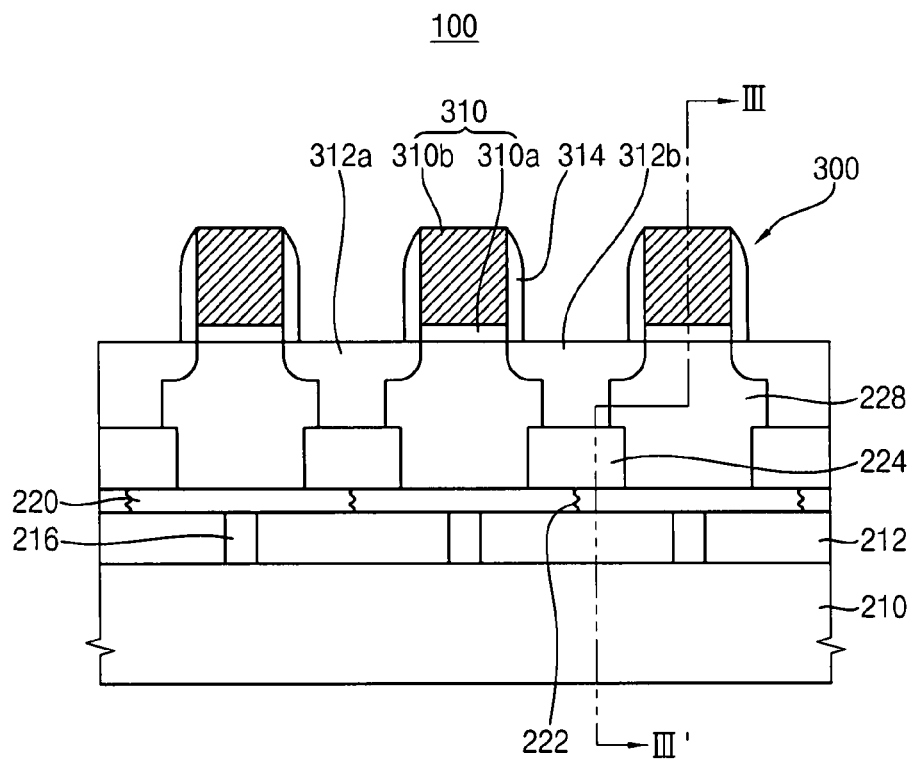
FIG. 2 is a cross-sectional view illustrating a semiconductor device in accordance with some embodiments of the present invention.

FIG. 2 is a cross-sectional view illustrating a semiconductor device in accordance with some embodiments of the present invention. As shown in FIG. 2, the semiconductor device 100 may include a first single-crystalline layer 210, an insulating layer pattern 212, a seed layer 216, a second single-crystalline layer 220, a transcription-preventing pattern 224, a third single-crystalline layer 228 and a metal-oxide semiconductor (MOS) transistor 300 formed on the third single-crystalline layer 228.

The first single-crystalline layer 210 may have a single-crystalline structure. For example, the first single-crystalline layer 210 may include single-crystalline silicon, single-crystalline germanium, single-crystalline silicon germanium and/or the like. The first single-crystalline layer 210 in some embodiments comprises a single-crystalline silicon substrate. In other embodiments, the first single-crystalline layer 210 may be a silicon-on-insulator (SOI) substrate, a germanium-on-insulator (GOI) substrate and/or the like.

The insulating layer pattern 212 is formed on the first single-crystalline layer 210. The insulating layer pattern 212 may have at least one opening 214 for partially exposing the first single-crystalline layer 210. The opening 214 may be formed by partially removing an insulating layer. The insulating layer may be partially removed, for example, by an etching process using an etching mask, such as a photoresist pattern and/or a hard mask. For example, the insulating layer pattern 212 may include an oxide.

The seed layer 216 may fill up the opening 214. For example, the seed layer 216 may be formed in the opening 214 by a selective epitaxial growth (SEG) process. Thus, the seed layer 216 may have a crystalline structure substantially the same as that of the first single-crystalline layer 210. In some embodiments, when the first single-crystalline layer 210 is single-crystalline silicon, the seed layer 216 formed by the SEG process may have a single-crystalline silicon structure. In other embodiments, when the first single-crystalline layer 210 is single-crystalline germanium, the seed layer 216 formed by the SEG process may have a single-crystalline germanium structure.

As described above, the seed layer 216 may be formed in the opening 214 by the SEG process. For example, the seed layer 216 grows from the surface of the first single-crystalline layer 210 exposed through the opening 214. Thus, the seed layer 216 may have a crystalline structure substantially the same as that of the first single-crystalline layer 210.

When the formed seed layer 216 has an upper surface higher than an entrance (upper end) of the opening 214 of the insulating layer pattern 212, the portion of the seed layer 216 above the entrance of the opening 214 may be removed, for example, by a chemical mechanical polishing (CMP) process.

The second single-crystalline layer 220 is formed on a first resultant structure including the seed layer 216. Here, the first resultant structure includes the insulating layer pattern 212 and the seed layer 216. That is, the second single-crystalline layer 220 may be formed on the insulating layer pattern 212 and the seed layer 216.

The second single-crystalline layer 220 may be formed by irradiating a first laser beam to a first amorphous crystalline layer in a liquid state to transform the first amorphous crystalline layer into the second single-crystalline layer 220. In other words, laser annealing may be used to transform the amorphous crystalline layer into a single crystalline layer. The seed layer 216 may be used as a seed. Thus, the second single-crystalline layer 220 may have a crystalline structure substantially the same as that of the seed layer 216. For example, the first amorphous crystalline layer may be formed on the insulating layer pattern 212 and the seed layer 216. The first laser beam is then irradiated onto the first amorphous crystalline layer to transform the crystalline structure of the first amorphous crystalline layer into the single-crystalline structure, thereby forming the second single-crystalline layer 220 shown in FIG. 2. For example, the first laser beam may have enough energy to melt the first amorphous crystalline layer.

In some embodiments, when the seed layer 216 includes the single-crystalline silicon layer, the second single-crystalline layer 220 formed by laser irradiating may have the single-crystalline silicon structure.

In addition, the crystalline structure of the first amorphous crystalline layer may be transformed along a vertical direction and a horizontal direction. The phase change and crystalline structure transformation of the first amorphous crystalline layer may occur in several nanoseconds, so that the first amorphous crystalline layer in the liquid state may not flow down from the first single-crystalline layer 210 during this rapid transformation.

When the first amorphous crystalline layer is transformed into the single-crystalline by laser irradiating annealing, defective portions 222 may be generated in the second single-crystalline layer 220. For example, the defective portions 222 may be formed in a portion of the second single-crystalline layer 220 corresponding to a middle portion of the insulating layer pattern 212. When the crystalline structure transformation of the amorphous crystalline layer is processed along the horizontal direction on the insulating layer pattern 212, the defective portions 222 may be generated at a meeting point at which each of the first amorphous crystalline layers transformed toward opposite directions meet. Accordingly, when a stack structure including a plurality of other upper layers is formed on the second single-crystalline layer 220 having the defective portions 222, the defective portions 222 may be transcribed to the upper layers. Thus, the semiconductor device 100 may have deteriorated electrical characteristics.

To reduce the risk of or even prevent the defective portions 222 from being transcribed into the upper layers, the transcription-preventing pattern 224 is formed on the defective portions 222 in the second single-crystalline layer 220. The transcription-preventing pattern 224 may have a size/horizontal width selected to cover the defective portions 222.

The transcription-preventing pattern 224 may include an insulation material. For example, the transcription-preventing pattern 224 may include an oxide, a nitride and/or the like, alone or in a combination thereof. Thus, the transcription-preventing pattern 224 may limit or even prevent the defective portions 222 in the second single-crystalline layer 220 from being transcribed to the upper layers. As a result, the transcription-preventing layer 224 may improve the electrical characteristics of the semiconductor device 100.

The third single-crystalline layer 228 is formed on a second resultant structure including the transcription-preventing pattern 224. The second resultant structure includes the transcription-preventing pattern 224 and the second single-crystalline layer 220. That is, the third single-crystalline layer 228 is formed on the transcription-preventing pattern 224 and the second single-crystalline layer 220.

The third single-crystalline layer 228 may be formed from a second amorphous crystalline layer (not shown) using the second single-crystalline layer 220 as a seed. Thus, the third single-crystalline layer 228 may have a crystalline structure substantially the same as that of the second single-crystalline layer 220. For example, the second amorphous crystalline layer may be formed on the transcription-preventing pattern 224 and the second single-crystalline layer 220. A second laser annealing is carried out to transform the crystalline structure of the second amorphous crystalline layer into a single-crystalline structure, thereby forming the third single-crystalline layer 228. The second laser beam process may use enough energy to melt the second amorphous crystalline layer. The apparatus for providing the second laser beam process may be substantially the same as an apparatus for providing the first laser beam process.

In some embodiments, when the second single-crystalline layer 220 is a single-crystalline silicon layer, the third single-crystalline layer 228 may have a single-crystalline silicon structure. Thus, the first single-crystalline layer 210, the second single-crystalline layer 220 and the third single-crystalline layer 228 may have substantially the same structure.

The transcription-preventing pattern 224 may limit or even prevent the defective portions 222 from being transcribed into the third single-crystalline layer 228, so that the defective portions 222 may not be formed in the third single-crystalline layer 228. In some embodiments, the second single-crystalline layer 220 and the third single-crystalline layer 228 may be integrally formed as one single-crystalline layer having the transcription-preventing pattern 224.

The MOS transistor 300 is formed on the third single-crystalline layer 228. The MOS transistor 300 may include a gate pattern 310, source/drain regions 312a and 312b, and a gate spacer 314.

The gate pattern 210 is formed on the third single-crystalline layer 228. The gate pattern 210 may include a gate insulating layer 310a and a gate conductive layer 310b. The source/drain regions 312a and 312b may be formed under a surface of the third single-crystalline layer 228 that makes contact with both sidewalls of the gate pattern 310. The gate spacer 314 may be formed on sidewalls of the gate insulating layer 310a and the gate conductive layer 310b.

The transcription-preventing pattern 224 may be formed adjacent to the source/drain regions 312a and 312b. For example, the transcription-preventing pattern 224 may have a thickness extending from the second single-crystalline layer 220 to a lower portion of the source/drain regions 312a and 312b.

Further, the transcription-preventing pattern 224 may limit or even block the flow of leakage current from the source/drain regions 312a and 312b. Thus, junction leakage may be reduced and a capacitor coupled to the MOS transistor 300 may have improved characteristics.

In some embodiments, the insulating layer pattern 212, the seed layer 216, the second single-crystalline layer 220, the transcription-preventing pattern 224, the third single-crystalline layer 228, the gate pattern 310 and the source/drain regions 312a and 312b are formed sequentially on the first single-crystalline layer 210. In some embodiments, the first single-crystalline layer 210 may include another gate pattern (not shown). For example, as illustrated above, another transistor (not shown) may be formed under the first single-crystalline layer 210 in the semiconductor device 100 having the stack structure.

A further insulating layer (not shown) may be formed to cover the gate pattern 310. In addition, a fourth single-crystalline layer (not shown) may be formed on the further insulating layer. For example, the gate pattern 310 and the source/drain regions 312a and 312b may be formed under the fourth single-crystalline layer. Thereafter, a plurality of layers (not shown) may be formed on the fourth single-crystalline layer. This plurality of the layers may be substantially the same as the above-illustrated layers. Thus, the semiconductor device 100 may have a stack structure.

According to some embodiments, when the amorphous crystalline layer is transformed into the single-crystalline layer by irradiating the laser beam onto the amorphous crystalline layer (e.g., laser annealing), the transcription-preventing pattern 224 may limit or even prevent the defective portions 222 from being transcribed into the upper layers. Thus, the defective portions 222 may not be transcribed into the upper layers. Accordingly, the electrical reliability of the semiconductor device 100 may be improved. Further, when the transcription-preventing pattern 224 is formed adjacent to the source/drain regions 312a and 312b, the junction leakage may be reduced by minimizing the junction depletion region.

Figure 3:
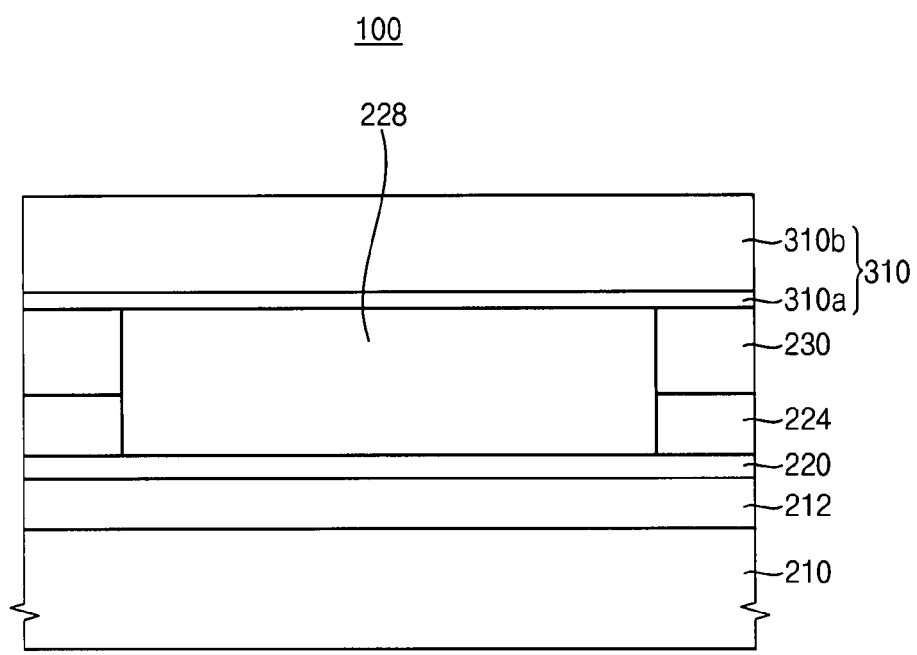
FIG. 3 is a cross-sectional view taken along a line III-III' in FIG. 2.

FIG. 3 is a cross-sectional view taken along a line III-III' in FIG. 2. As seen in FIG. 3, the semiconductor device 100 may further include an isolation layer 230 including an insulating material. For example, the isolation layer 230 may include a shallow trench isolation (STI) layer.

The isolation layer 230 is formed on the second single-crystalline layer 220. When the transcription-preventing pattern 224 is formed on the second single-crystalline layer 220, the isolation layer 230 may be simultaneously formed on the second single-crystalline layer 220. For example, the transcription-preventing pattern 224 and the isolation layer 230 may be simultaneously formed by a laser-induced epitaxial growth (LEG) process. Thus, the manufacturing process of the semiconductor device 100 may become simpler. Further, the semiconductor device 100 may have improved productivity and reliability.

In some embodiments, the isolation layer 230 may have an upper face different from that of the transcription-preventing pattern 224. In addition, the isolation layer 230 may be spaced apart from the transcription-preventing pattern 224. For example, the isolation layer 230 may have a thickness greater than that of the transcription-preventing pattern 224.

In some embodiments, after the transcription-preventing pattern 224 is formed on the second single-crystalline layer 220, the isolation layer 230 may be formed on the transcription-preventing pattern 224. The isolation layer 230 may have a relatively thin thickness because of the thickness of the transcription-preventing pattern 224.

Accordingly, when the transcription-preventing pattern 224 and the isolation layer 230 are simultaneously formed on the second single-crystalline layer 220 or the isolation layer 230 is formed on the transcription-preventing pattern 224, the isolation layer 230 may have improved gap-fill characteristics.

Figure 4A:
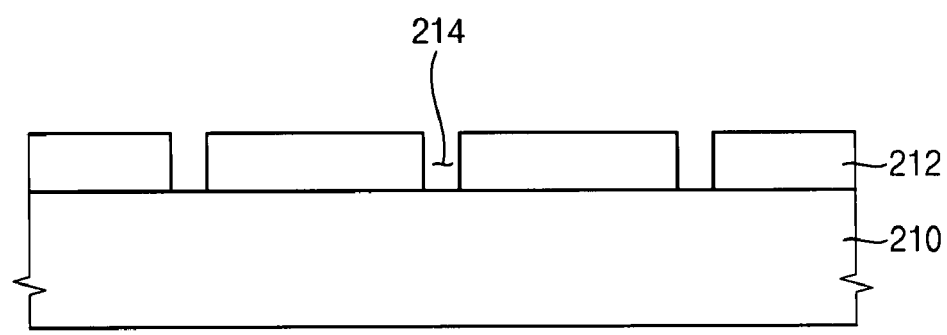

FIGS. 4A through 4I are cross-sectional views illustrating a method of manufacturing the semiconductor device in FIG. 2 according to some embodiments of the present invention. Referring first to FIG. 4A, the first single-crystalline layer 210 may be provided. The first single-crystalline layer 210 may have a bulky structure. The first single-crystalline layer 210 may include a single-crystalline material. For example, the single-crystalline material may be single-crystalline silicon, single-crystalline germanium, single-crystalline silicon germanium and/or the like. For purposes of description of FIGS. 4A through 4I, the first single-crystalline layer 210 will be referred to as a single-crystalline silicon layer.

The insulating layer pattern 212 is formed on the first single-crystalline layer 210. The insulating layer pattern 212 may have at least one opening 214 for partially exposing the first single-crystalline layer 210.

In some embodiments, forming the insulating layer pattern 212 includes forming an insulating layer on the first single-crystalline layer 210. For example, the insulating layer may include an oxide. The insulating layer may be formed by a thermal oxidation process. The insulating layer is then patterned. For example, the insulating layer may be patterned by an etching process using a photoresist pattern as an etching mask. Thus, the insulating layer pattern 212 having the opening 214 may be formed on the first single-crystalline layer 210. As described above, the opening 214 may partially expose the first single-crystalline layer 210. For example, when the insulating layer includes an oxide, the insulating layer pattern 212 may include the oxide.

Figure 4B:
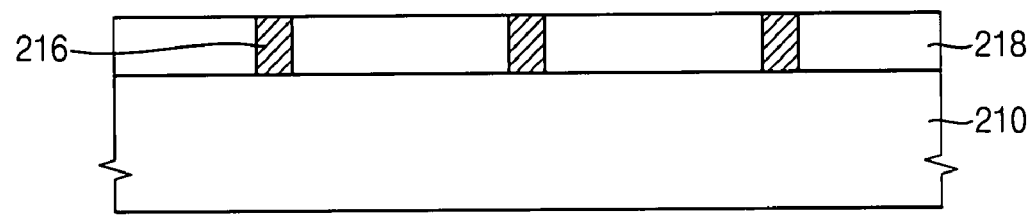

Referring to FIG. 4B, the seed layer 216 is formed in the opening 214, for example, by an SEG process. The seed layer 216 may be grown from the surface of the first single-crystalline layer 210 exposed through the opening 214. Thus, the seed layer 216 may have the crystalline structure substantially the same as that of the first single-crystalline layer 210.

When the first single-crystalline layer 210 is a single-crystalline silicon layer, the seed layer 216 may be a single-crystalline silicon layer. When the first single-crystalline layer 210 is a single-crystalline germanium layer, the seed layer 216 may be a single-crystalline germanium layer.

When the seed layer 216 has an upper surface higher than an upper entrance of the opening 214, the portion of the seed layer 216 higher than the entrance of the opening 214 may be removed, for example, by a CMP process.

Figure 4C:
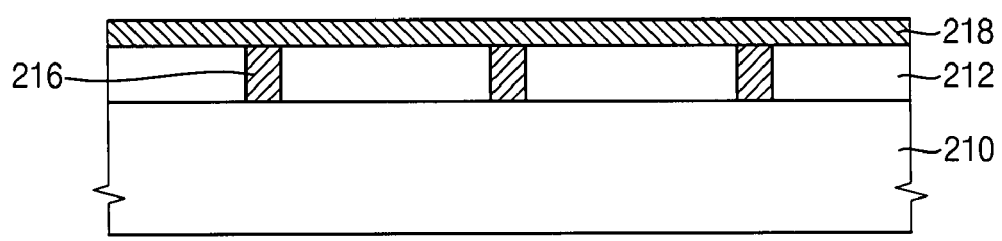

Referring to FIG. 4C, the first amorphous crystalline layer 218 is formed on the first resultant structure including the seed layer 216. The first resultant structure as shown includes the insulating layer pattern 212 and the seed layer 216. That is, the first amorphous crystalline layer 218 is formed on the insulating layer pattern 212 and the seed layer 216. The first amorphous crystalline layer 218 may be formed, for example, by a chemical vapor deposition (CVD) process. In addition, when a stepped portion is formed on the upper surface of the first amorphous crystalline layer 218, the stepped portion may be removed, for example, by a planarization process, such as a CMP process. In some embodiments, the first amorphous crystalline layer 218 may include amorphous crystalline silicon, amorphous crystalline germanium and/or amorphous crystalline silicon germanium.

Figure 4D:
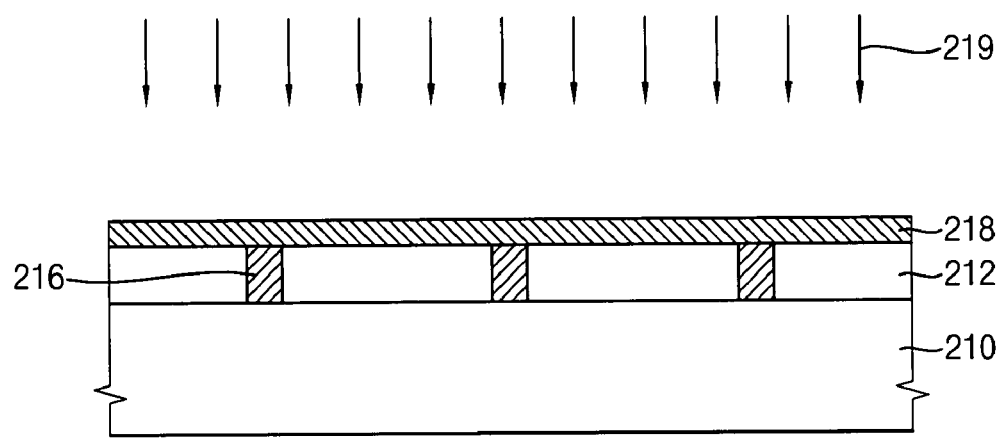
Figure 4E:
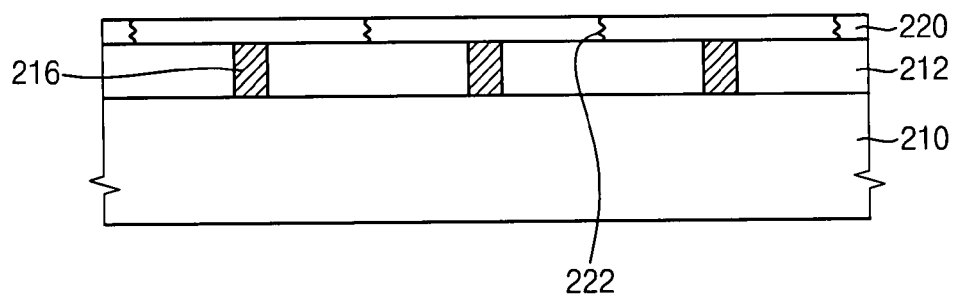

Referring to FIGS. 4D and 4E, the first laser beam 219 is applied to anneal the first amorphous crystalline layer 218. For example, the first laser beam 219 may have enough energy to melt the first amorphous crystalline layer 218.

When the first laser beam 219 is irradiated into the first amorphous crystalline layer 218, the first amorphous crystalline layer 218 may be phase-changed. For example, the first amorphous crystalline layer 218 may be melted. Thus, the first laser beam melts the first amorphous crystalline layer 218 to transform the first amorphous crystalline layer from a solid state into a liquid state. The first amorphous crystalline layer 218 may be transformed into the liquid state from the upper face to the lower face thereof. The lower surface of the first amorphous crystalline layer 218 may be an upper face of the seed layer 216 and the insulating layer pattern 212. When the first amorphous crystalline layer 218 is phase-changed, the crystalline structure of the first amorphous crystalline layer 218 may be transformed into the single-crystalline structure using the seed layer 216 as the seed.

As illustrated above, the first laser beam 219 may input enough energy to sufficiently melt the first amorphous crystalline layer 218. This is because the first amorphous crystalline layer 218 is transformed from the upper face to the lower face thereof. When the first amorphous crystalline layer 218 includes silicon, a melting temperature of the first amorphous crystalline layer 218 may be raised to about 1,410° C. Accordingly, the first laser beam 219 may be adjusted to have enough energy to raise the temperature of the first amorphous crystalline layer 218 above than about 1,410° C. When the first amorphous crystalline layer 218 includes germanium having the melting point of about 958.5° C., the first laser beam 219 may be adjusted to have enough energy to raise the temperature of the first amorphous crystalline layer 218 above about 958.5° C.

The crystalline structure of the first amorphous crystalline layer 218 may be transformed along a vertical direction and a horizontal direction. The phase change and crystalline structure transformation of the first amorphous crystalline layer 218 may be completed in several nanoseconds, so that the first amorphous crystalline layer 218 in the liquid state may not flow down from the first single-crystalline layer 210 during the transformation.

Thus, the first amorphous crystalline layer 218 may be phase-changed through annealing by irradiation from the first laser beam 219. The first amorphous crystalline layer 218 may be transformed to have the single-crystalline structure. Thus, the first amorphous crystalline layer 218 may be transformed into the second single-crystalline layer 220 using the seed layer 216 as the seed.

When the first amorphous crystalline layer 218 is transformed into the second single-crystalline layer 220 by the LEG process, the defective portions 222 may be generated on a region at which a growth front meets. For example, the defective portions 222 may have a protrusion shape as seen in FIG. 4E.

When a stack structure including a plurality of other upper layers is formed on the second single-crystalline layer 220, the defective portions 222 may be transcribed into the upper layers. Accordingly, the crystalline degree of the single-crystalline layer and the electrical reliability of the semiconductor device 100 may be deteriorated.

Figure 4F:
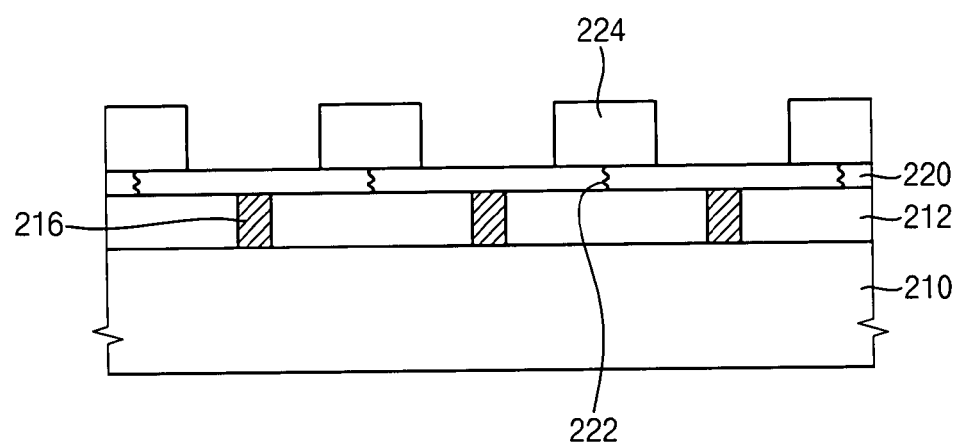

Referring to FIG. 4F, the transcription-preventing pattern 224 may be formed on the defective portions 222. The transcription-preventing pattern 224 may have a size/width selected to sufficiently cover a region including the defective portions 222, where the growth fronts meet.

The transcription-preventing pattern 224 may include an insulation material. For example, the transcription-preventing pattern 224 may include an oxide, a nitride and/or the like. These can be used alone or in a combination thereof. Thus, the transcription-preventing pattern 224 may limit or even prevent the defective portions 222 from being transcribed into the upper layers on the second single-crystalline layer 220. As a result, the transcription-preventing layer 224 may improve the electrical characteristics of the semiconductor device 100.

In some embodiments, the transcription-preventing pattern 224 may be formed at positions at which the isolation layer (not shown) will be formed. The isolation layer may then be formed on the transcription-preventing pattern 224. The isolation layer 230 may have a relatively thin thickness because of the thickness of the transcription-preventing pattern 224. In some embodiments, the transcription-preventing pattern 224 and the isolation layer may be simultaneously formed. Accordingly, the isolation layer may have improved gap-fill characteristics.

Figure 4G:
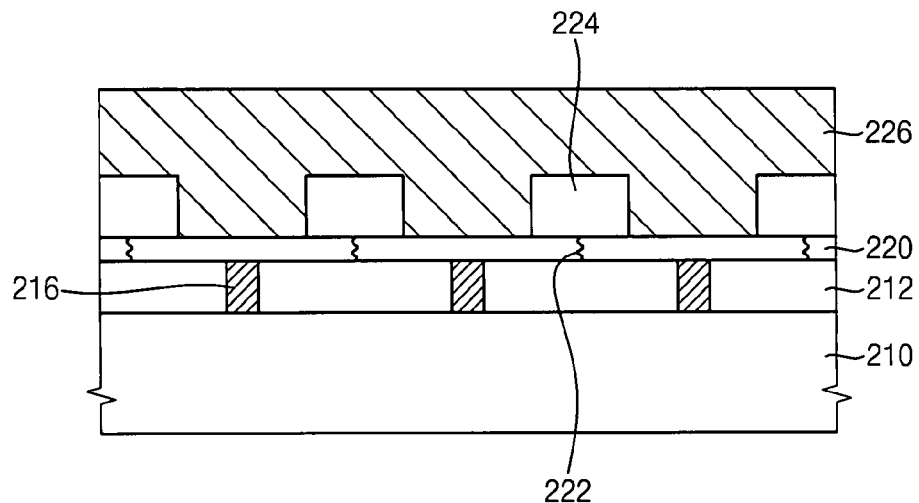

Referring now to FIG. 4G, the second amorphous crystalline layer 226 may be formed on the second resultant structure including the transcription-preventing pattern 224. The second resultant structure includes the transcription-preventing pattern 224 and the second single-crystalline layer 220. That is, the second amorphous crystalline layer 226 is formed on the transcription-preventing pattern 224 and the second single-crystalline layer 220. The second amorphous crystalline layer 226 may be formed so as to cover the transcription-preventing pattern 224. For example, the second amorphous crystalline layer 226 may be formed by a CVD process. When the stepped portion is formed on the second amorphous crystalline layer 226, the stepped portion may be removed, for example, by a planarization process, such as a CMP process.

The second amorphous crystalline layer 226 may include amorphous crystalline silicon, amorphous crystalline germanium, amorphous crystalline silicon germanium and/or the like.

Figure 4H:
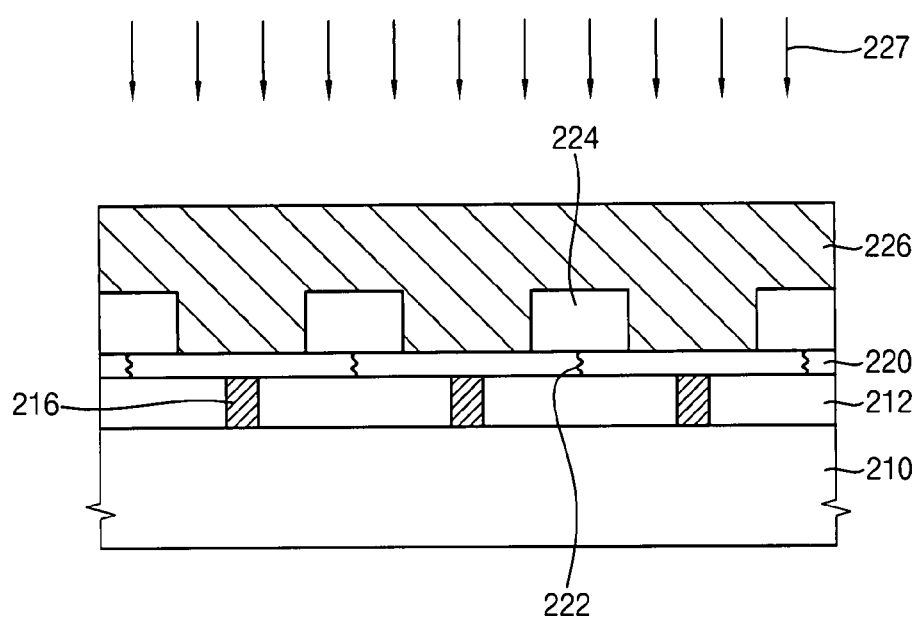
Figure 41:
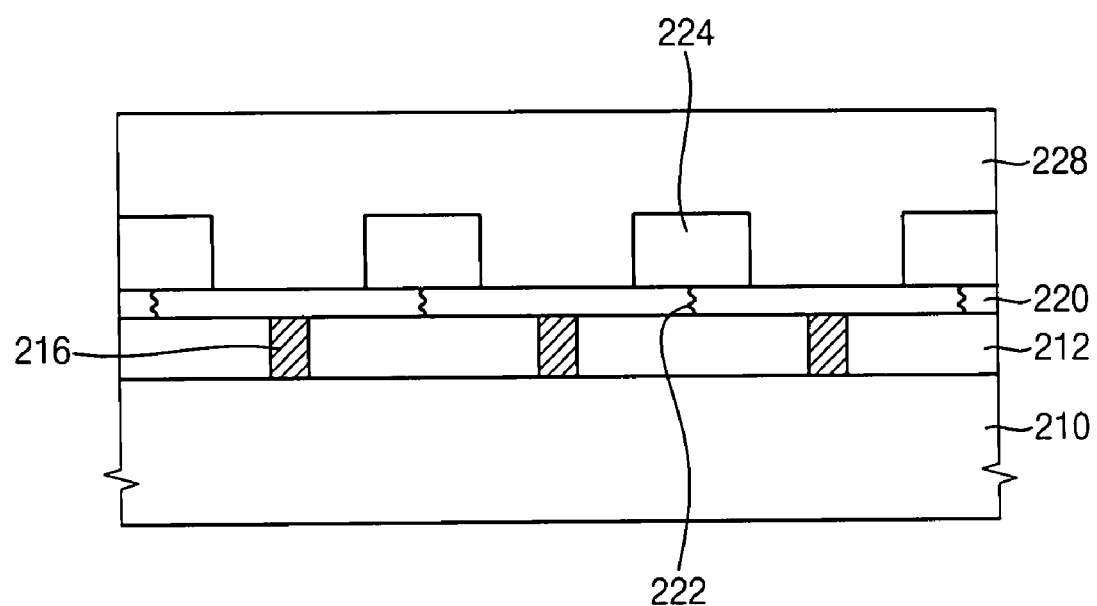

Referring to FIGS. 4H and 4I, the second laser beam 227 is irradiated onto the second amorphous crystalline layer 226 to laser anneal the second amorphous crystalline layer 226. The second laser beam 227 may generate enough energy to melt the second amorphous crystalline layer 226 so as to phase-change the second amorphous crystalline layer 226. During laser annealing, the second amorphous crystalline layer 226 may be transformed from the solid state into the liquid state. Particularly, the second amorphous crystalline layer 226 may be transformed into the liquid state from the upper face to the lower face of the second amorphous crystalline layer 226. When the second amorphous crystalline layer 226 is phase-changed, the crystalline structure of the second amorphous crystalline layer 226 may be transformed into the single-crystalline by using the second single-crystalline layer 220 as the seed. Accordingly, the crystalline structures of the first single-crystalline layer 210, the second single-crystalline layer 220 and the third single-crystalline layer 228 may have substantially the same crystalline structure.

As described above, the second laser beam 227 application induces enough energy to melt the second amorphous crystalline layer 226. The second amorphous crystalline layer 226 may be transformed into the liquid state from the upper surface to the lower face thereof. The second laser beam 227 may be used to create a temperature substantially the same as that created by the first laser beam 219 application. The apparatus providing the second laser beam may be substantially the same as the apparatus providing the first laser beam.

When the second amorphous crystalline layer 226 is phase-changed by the irradiation of the second laser beam 227, the second amorphous crystalline layer 226 may be transformed into the third single-crystalline layer 228 by using the second single-crystalline layer 220 as the seed. As seen in the illustrated embodiments of FIG. 4G, the third single-crystalline layer 228 is thicker than the second single-crystalline layer 220 and the third single-crystalline layer 228 covers the transcription-preventing pattern 224 and the source/drain regions 312a and 312b.

As described above, when the third single-crystalline layer 228 is formed by irradiating the second laser beam 227 to the second amorphous crystalline layer 226, the transcription-preventing pattern 224 may limit or even prevent the defective portions 220 from being transcribed to the third single-crystalline layer 228. Thus, the defective portions 222 may not be formed in the third single-crystalline layer 228. Further, the transcription-preventing layer 224 may improve the electrical characteristics of the semiconductor device 100. In addition, a semiconductor structure, such as the gate pattern, the metal line, the logic device, etc. may be further formed on the third single-crystalline layer 228.

Referring again to FIGS. 2 and 3, the MOS transistor 300 may be formed on the third single-crystalline layer 228. The gate pattern 310 including the gate insulating layer 310a and the gate conductive layer 310b is formed on the third single-crystalline layer 228. The source/drain regions 312a and 312b are formed in the third single-crystalline layer 228 and make contact with the both sidewalls of the gate pattern 310. When the gate spacer 314 is formed at the both sidewalls of the gate pattern 310, the source/drain regions 312a and 31b may have an LDD structure.

The transcription-preventing pattern 224 is shown formed adjacent to the source/drain regions 312a and 312b. Thus, the transcription-preventing pattern 224, as an insulating material, may limit or even block the flow of leakage current from the source/drain regions 312a and 312b. As a result, the transcription-preventing pattern 224 may improve the junction leakage characteristics.

Figure 5:
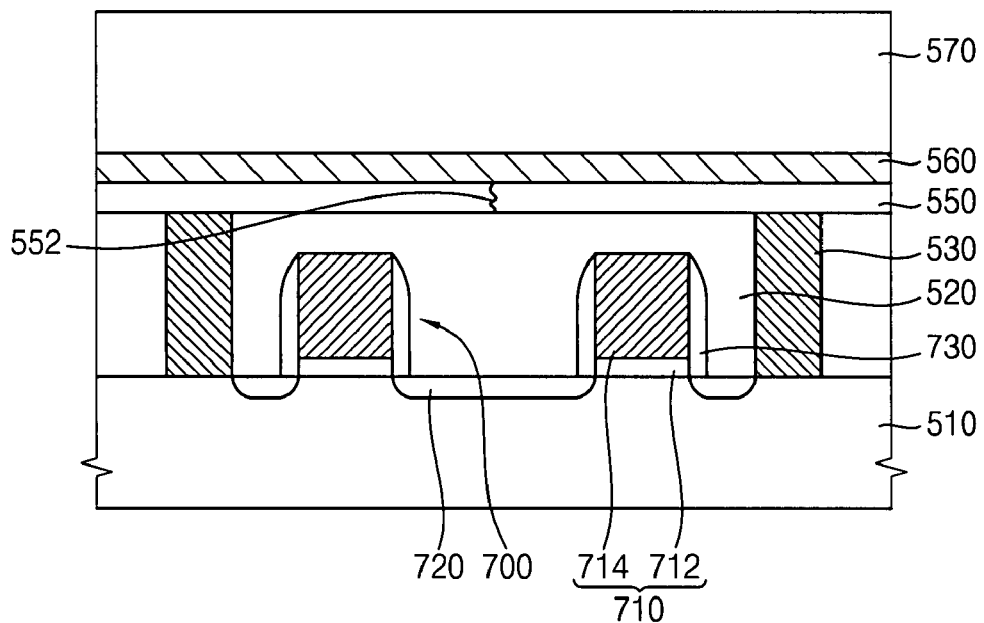
FIG. 5 is a cross-sectional view illustrating a semiconductor device in accordance with further embodiments of the present invention.

FIG. 5 is a cross-sectional view illustrating a semiconductor device in accordance with further embodiments of the present invention. The semiconductor device illustrated in FIG. 5 may include features substantially the same as those of the semiconductor device described above except as described below for the transcription-preventing layer. Thus, any overlapping details will not be described below except to the extent needed to further understanding of the present invention.

Referring to FIG. 5, the semiconductor device 400 includes a first single-crystalline layer 510, a first insulating layer pattern 520, a first seed layer 530, a second single-crystalline layer 550, a first transcription-preventing pattern 560 and a third single-crystalline layer 570.

Figure 6A:
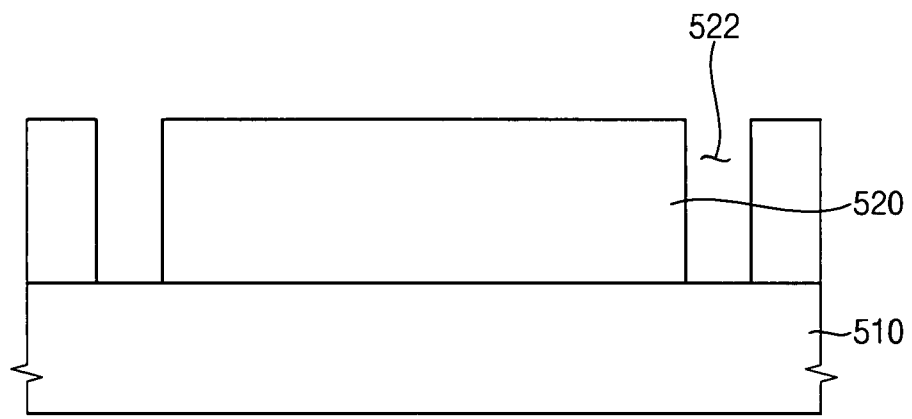
FIGS. 6A to 6G are cross-sectional views illustrating a method of manufacturing the semiconductor device of FIG. 5 in accordance with some embodiments of the present invention.

The first insulating layer pattern 520 is formed on the first single-crystalline layer 510. The first insulating layer pattern 520 may have at least one opening 522 (as shown in FIG. 6A). The opening 522 may partially expose the first single-crystalline layer 510.

The first seed layer 530 may fill up the opening 522. For example, the first seed layer 530 may be formed by an SEG process to sufficiently fill up the opening 522. As a result, the first seed layer 530 may have a crystalline structure substantially the same as that of the first single-crystalline layer 510.

The second single-crystalline layer 550 is formed on a resultant structure including the first seed layer 530. The resultant structure may include the first insulating layer pattern 520 and the first seed layer 530. That is, the second single-crystalline layer 550 is formed on the first insulating layer pattern 520 and the first seed layer 530.

The second single-crystalline layer 550 may be formed by irradiating a laser beam onto an amorphous crystalline layer to transform the amorphous crystalline layer into the second single-crystalline layer 550. The first seed layer 530 may be used a seed. Thus, the second single-crystalline layer 550 may have a crystalline structure substantially the same as that of the first seed layer 530.

When the laser beam is irradiated onto the amorphous crystalline layer to transform the crystalline structure of the amorphous crystalline layer, a first defective portion 552 may be generated in the second single-crystalline layer 550. For example, the first defective portion 552 may be formed in a portion of the second single-crystalline layer 550 corresponding to a middle portion of the first insulating layer pattern 520. The first defective portion 552 may have a convex shape or a concave shape.

When the semiconductor device 400 has the stack structure, the first defective portion 552 may be transcribed to the upper layers. Accordingly, the semiconductor device 400 may have deteriorated electrical characteristics due to the first defective portion 552.

To limit or even prevent the first defective portion 552 from being transcribed into the upper layers, the first transcription-preventing pattern 560 is formed on the second single-crystalline layer 550 having the first defective portion 552. For example, the first transcription-preventing pattern 560 may include silicon germanium. In some embodiments, the first transcription-preventing pattern 560 may include silicon carbide, silicon germanium carbon and/or the like.

For example, epitaxial silicon and germanium gas provided from external devices may be combined to form the first transcription-preventing pattern 560. The epitaxial silicon may grow using the silicon of the second single-crystalline layer 550. The first transcription-preventing pattern 560 may be formed by various methods and processes. When the first transcription-preventing pattern 560 and the above-described single-crystalline layers are formed in the same chamber, efficiency of processes of manufacturing the semiconductor device 400 may be improved, and process time and manufacturing costs may be reduced.

The first transcription-preventing pattern 560 may cover the first defective portion 552. Accordingly, the first transcription-preventing pattern 560 may limit or even prevent the first defective portion 552 from being transcribed to the upper layers. For example, when the first transcription-preventing pattern 560 includes silicon germanium, the lattice constant of the silicon germanium layer may be greater than that of the silicon layer. Thus, the first defective portion 552 in the second single-crystalline layer 550 may be filtered by the first transcription-preventing pattern 560, so that the first defective portion 552 may not be transcribed into the upper layers. Further, the first transcription-preventing pattern 560 may improve the electrical characteristics of the semiconductor device 400.

The third single-crystalline layer 570 is formed on the first transcription-preventing pattern 560. The first transcription-preventing pattern 560 may limit or even prevent the first defective portion 552 from being transcribed the upper layers, so that other defective portions may not be generated in the third single-crystalline layer 570. Thus, the defective portions may not be generated in the third single-crystalline layer 570 formed on the first transcription-preventing pattern 560. Further, the first transcription-preventing pattern 560 may improve the electrical characteristics of the semiconductor device 400.

In addition, the semiconductor device 400 may further include a second insulating layer pattern (not shown), a second seed layer (not shown), a fourth single-crystalline layer (not shown), a second transcription-preventing layer (not shown) and a fifth single-crystalline layer (not shown). The second insulating layer pattern, the second seed layer, the fourth single-crystalline layer, the second transcription-preventing layer and the fifth single-crystalline layer may be sequentially formed on the third single-crystalline layer 570. For example, each of the second insulating layer pattern, the second seed layer, the fourth single-crystalline layer, the second transcription-preventing layer and the fifth single-crystalline layer may be substantially the same as that of each of the first insulating layer pattern 520, the first seed layer 530, the second single-crystalline layer 550, the first transcription-preventing layer 560 and the third single-crystalline layer 570.

In addition, the semiconductor device 400 may further include a plurality of structures formed on the fifth single-crystalline layer. The structures may have a structure and a shape substantially the same as those of the above-described layers.

For example, the second insulating layer to an m-th insulating layer, the second seed layer to an m-th seed layer, the fourth single-crystalline layer to an n-th single-crystalline layer, the second transcription-preventing layer to an o-th transcription-preventing layer, the fifth crystalline layer to a p-th crystalline layer may be sequentially and repeatedly formed on the third single-crystalline layer 570. In some embodiments, m may be a natural number of no less than 3, n may be an even number of no less than 6, o may be a natural number of no less than 3, and p may be an odd number of no less than 7. For example, the second insulating layer to the m-th insulating layer may be substantially the same as the first insulating layer, the second seed layer to the m-th seed layer may be substantially the same as the first seed layer, the fourth single-crystalline layer to the n-th single-crystalline layer may be substantially the same as the second single-crystalline layer, the second transcription-preventing layer to the o-th transcription-preventing layer may be substantially the same as the first transcription-preventing layer, and the fifth crystalline layer to the p-th crystalline layer may be substantially the same as the third single-crystalline layer.

A plurality of the transcription-preventing layers on the third single-crystalline layer 570, for example, the second transcription-preventing layer to o-th transcription-preventing layer, may include silicon germanium, silicon carbide, silicon germanium carbon and/or the like. As described above, a plurality of the transcription-preventing layers may limit or even prevent transcription of the defective portions generated by the LEG process. Thus, the transcription-preventing layers may limit or even prevent the defective portions from being transcribed to the upper layers. Accordingly, the transcription-preventing layers may improve the electrical characteristics of the semiconductor device 100.

For example, each of the fifth crystalline layer to the p-th crystalline layer may have a thickness greater than that of each of the fourth single-crystalline layer to the n-th single-crystalline layer. When the fourth single-crystalline layer to the n-th single-crystalline layer are formed, the fourth single-crystalline layer to the n-th single-crystalline layer may have a thickness of about 500 Å. The fifth crystalline layer to the p-th crystalline layer may have a thickness of about 4,500 Å to about 5,500 Å. This may be the case where a logic device, a metal line, etc. may be formed on the fifth crystalline layer to the p-th crystalline layer.

FIGS. 6A to 6G are cross-sectional views illustrating a method of manufacturing the semiconductor device in FIG. 5 according to some embodiments of the present invention. Referring to FIG. 6A, a first single-crystalline layer 510 is provided.

A first insulating layer pattern 520 is formed on the first single-crystalline layer 510. The first insulating layer pattern 520 may have at least one opening 522. The opening 522 may partially expose the first single-crystalline layer 510.

Figure 6B:
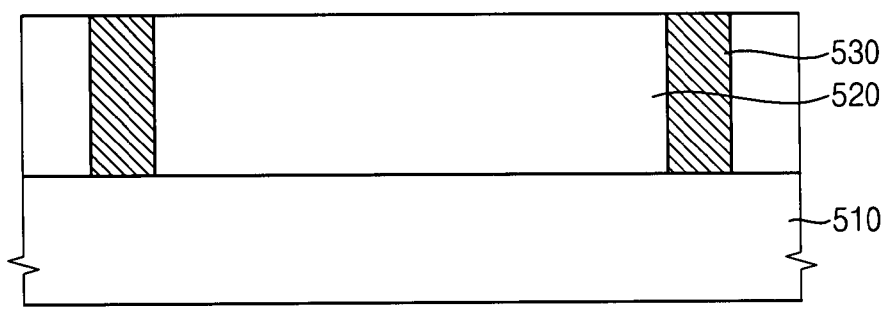

Referring to FIG. 6B, the first seed layer 530 is formed in the opening 522, for example, by an SEG process. The first seed layer 530 may grow up from the surface of the first single-crystalline layer 510. Thus, the first seed layer 530 may have a crystalline structure substantially the same as that of the first single-crystalline layer 510.

Figure 6C:
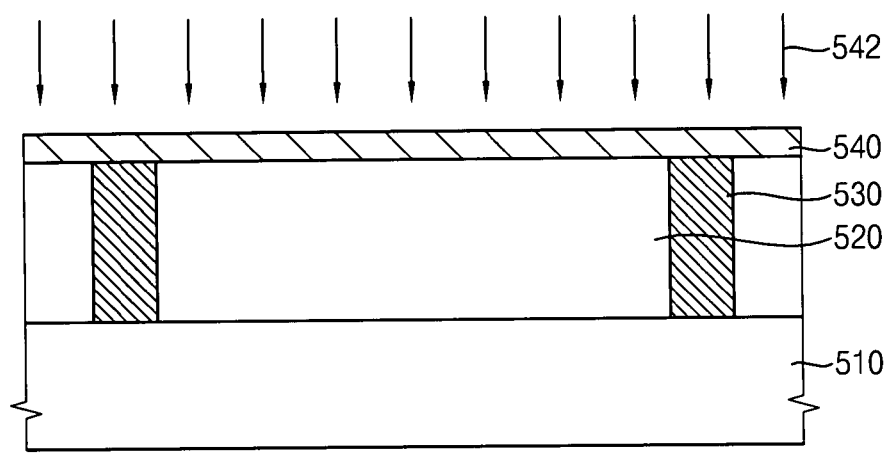

Referring to FIG. 6C, a first amorphous crystalline layer 540 is formed on a resultant structure. The resultant structure may include the first insulating layer pattern 520 and the first seed layer 530. That is, the first amorphous crystalline layer 540 is formed on the first insulating layer pattern 520 and the first seed layer 530. For example, the first amorphous crystalline layer 540 may be formed by a CVD process.

A laser beam 542 may be irradiated onto the first amorphous crystalline layer 540 to laser anneal the first amorphous crystalline layer 540. The laser beam 542 may generate enough energy to melt the first amorphous crystalline layer 540 from an upper face to a lower face of the first amorphous crystalline layer 540. The lower face of the first amorphous crystalline layer 540 as used herein refers to an interface between the first amorphous crystalline layer 540 and the resultant structure having the first insulating layer pattern 520 and the first seed layer 530.

Figure 6D:
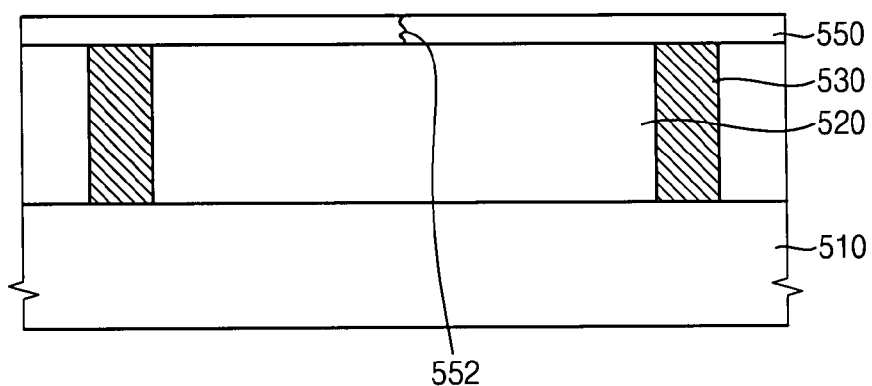

Referring to FIG. 6D, a second single-crystalline layer 550 is formed by irradiating the laser beam 542 onto the first amorphous crystalline layer 540. During laser annealing, the first amorphous crystalline layer 540 may be transformed from a solid state into a liquid state. When the first amorphous crystalline layer 540 is transformed into the liquid state, the first amorphous crystalline layer 540 may be transformed into a single-crystalline by using the seed layer 530 as a seed. Thus, the first amorphous crystalline layer 540 is transformed into the second single-crystalline layer 550. The crystalline structure of the first amorphous crystalline layer 540 may be transformed along a vertical direction and a horizontal direction.

When the first amorphous crystalline layer 540 is transformed into the second single-crystalline layer 550 by a LEG process using the seed layer 530 as the seed, a first defective portion 552 may be generated in the second single-crystalline layer 550. For example, the first defective portion 552 may be formed at a meeting point at which respective growth fronts meet. Here, the meeting point may be a meeting point at which each of the first amorphous crystalline layers 540 transformed toward opposite horizontal directions meet. Thus, the first defective portion 552 may be generated in a portion of the second single-crystalline layer 550 corresponding to at about a middle portion of the first insulating layer pattern 520. The first defective portion 552 may have a convex shape or a concave shape.

When a stack structure including a plurality of other upper layers is formed on the second single-crystalline layer 550, the first defective portion 552 may be transcribed to the upper layers. Accordingly, the upper layers may have deteriorated crystallinity. Further, the semiconductor device may have deteriorated electrical characteristics.

Figure 6E:
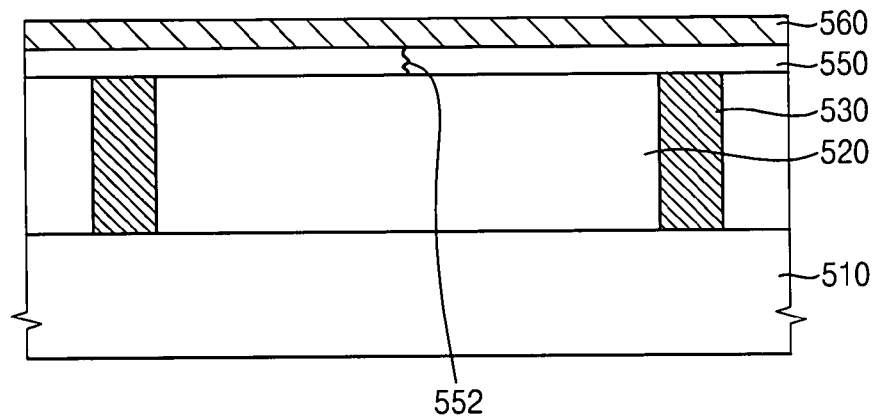

Referring to FIG. 6E, to limit or even prevent the first defective portion 552 from being transcribed into the upper layers, a first transcription-preventing pattern 560 is formed on the second single-crystalline layer 550 including the first defective portion 552. The first transcription-preventing pattern 560 may sufficiently cover the first defective portion 552. The first transcription-preventing pattern 560 may limit or even prevent the first defective portion 552 from being transcribed to the upper layers. Thus, the first transcription-preventing pattern 560 may improve the electrical characteristics of the semiconductor device.

In some embodiments, epitaxial silicon and germanium gas provided from external devices (not shown) may be combined to form the first transcription-preventing pattern 560. The epitaxial silicon may grow using the silicon of the second single-crystalline layer 550. The first transcription-preventing pattern 560 and the above-described single-crystalline layers may be formed in the same chamber. Thus, the efficiency of processes of manufacturing the semiconductor device may be improved, and process time and manufacturing costs may be reduced.

Figure 6F:
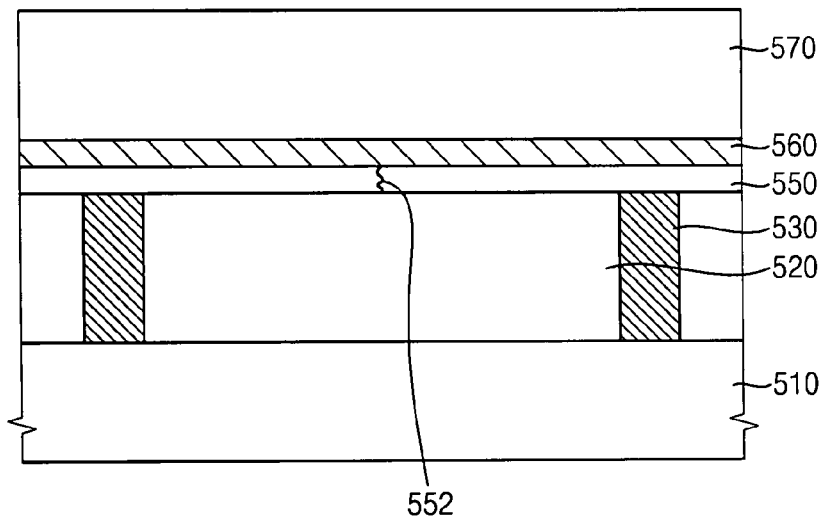

Referring to FIG. 6F, a third single-crystalline layer 570 is formed on the first transcription-preventing pattern 560. For example, the third single-crystalline layer 570 may be formed by a CVD process. The third single-crystalline layer 570 may be formed to have a thickness greater than that of the second single-crystalline layer 550. The second single-crystalline layer 550 formed by the LEG process may be formed to have a relatively thin thickness due to characteristics of the LEG process. Further, a gate pattern, a metal line, a logic device, etc. may be further formed on the third single-crystalline layer 570.

Figure 6G:
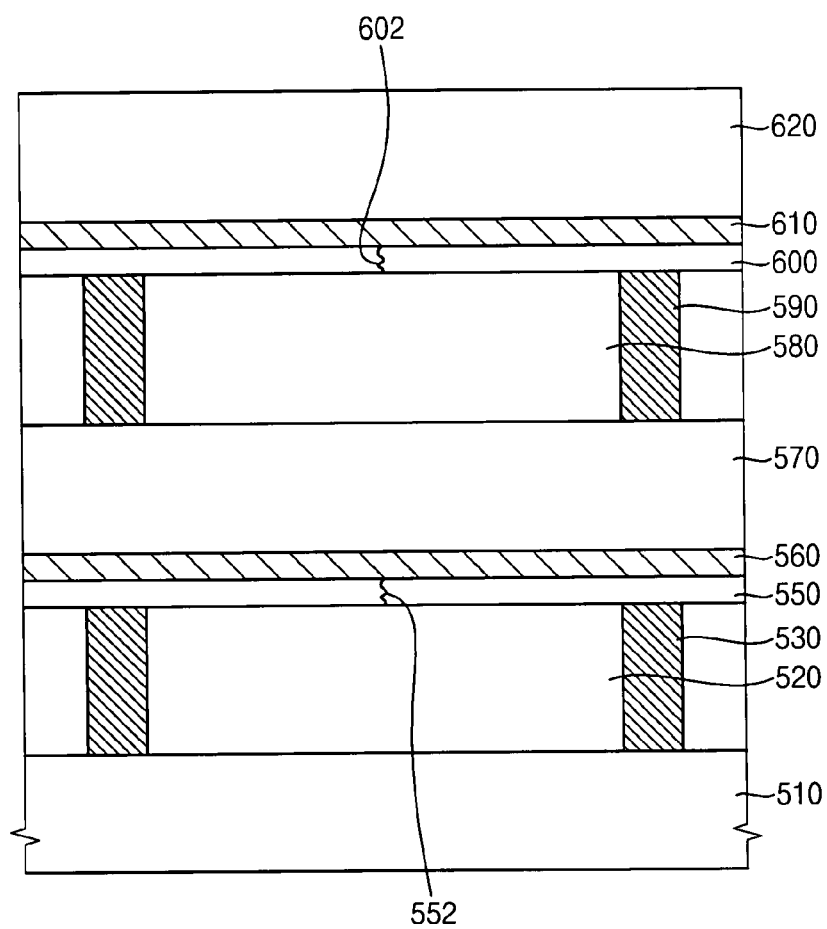

Referring to FIG. 6G, the semiconductor device 400 may further include an upper structure formed on the third single-crystalline layer 570 by processes substantially the same as the above-described processes.

For example, a second insulating layer pattern 580 may be formed on the third single-crystalline layer 570. Here, the second insulating layer pattern 580 may be substantially the same as that of the first insulating layer pattern 520. The second insulating layer pattern 580 may have at least one opening for partially exposing the third single-crystalline layer 570.

An SEG process is performed. A second seed layer 590 may fill up the opening by the SEG process. The SEG may be processed from the surface of the third single-crystalline layer 570. Accordingly, the second seed layer 590 may have a crystalline structure substantially the same as that of the third single-crystalline layer 570.

A second amorphous crystalline layer (not shown) may be formed on a resultant structure including the second insulating layer pattern 580 and the second seed layer 590. That is, the second amorphous crystalline layer (not shown) is formed on the second insulating layer pattern 580 and the second seed layer 590.

A fourth single-crystalline layer 600 is formed by irradiating a laser beam to the second amorphous crystalline layer (laser annealing) to transform the second amorphous crystalline layer into the fourth single-crystalline layer 600. The fourth single-crystalline layer 600 may have a crystalline structure substantially the same as that of the second seed layer 590. When the fourth single-crystalline layer 600 is formed, a second defective portion 602 may be generated in the fourth single-crystalline layer 600. As described above, the second defective portion 602 may be formed at a meeting point at which growth fronts meet.

A second transcription-preventing layer 610 is formed on the fourth single-crystalline layer 600. For example, the second transcription-preventing layer 610 may include silicon germanium, silicon carbide, silicon germanium carbon and/or the like. The second transcription-preventing layer 610 may limit or even prevent the second defective portion 602 from being transcribed to upper layers. Further, the semiconductor device may have improved electrical characteristics.

In addition, the second transcription-preventing pattern layer 610 may be formed by the epitaxial growth process using the fourth single-crystalline layer 600, so that the second transcription-preventing pattern layer 610 and the fourth single-crystalline layer 600 may be formed in the same chamber. Thus, the efficiency of the process may be improved and manufacturing costs and time may be reduced.

A fifth single-crystalline layer 620 is shown formed on the second transcription-preventing pattern layer 610. The fifth single-crystalline layer 620 may be formed to be thicker than the fourth single-crystalline layer 600. Further, other semiconductor structures may be formed on the fifth single-crystalline layer 620.

According to some embodiments of the present invention, when defective portions are generated in a single-crystalline layer, a transcription-preventing pattern or a transcription-preventing layer may cover the defective portions. Thus, the transcription-preventing pattern or the transcription-preventing layer may limit or even prevent the defective portions from being transcribed into an upper layer. Further, a semiconductor device may have improved electrical characteristics.

In addition, the transcription-preventing pattern or the transcription-preventing layer may be formed adjacent to source/drain regions. Thus, the transcription-preventing pattern or the transcription-preventing layer may limit or even block the flow of leakage current.

Further, the transcription-preventing pattern or the transcription-preventing layer and an isolation layer may be formed together. Thus, the gap-fill characteristics of the isolation layer may be improved.

Further, the transcription-preventing pattern or the transcription-preventing layer may be formed with other single-crystalline layers in the same chamber. Thus, the efficiency of the processes may be improved and manufacturing time and costs may be reduced.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:
1. An integrated circuit device, comprising:
a first single-crystalline layer;

an insulating layer pattern on the first single-crystalline layer, the insulating layer pattern having an opening therein that partially exposes the first single-crystalline layer;
a seed layer in the opening;
a second single-crystalline layer on the insulating layer pattern and the seed layer, the second single-crystalline layer having a crystalline structure substantially the same as that of the seed layer;
a transcription-preventing pattern on the second single-crystalline layer; and
a third single-crystalline layer directly on the transcription-preventing pattern and the second single-crystalline layer, wherein the transcription-preventing pattern is configured to limit transcription of defective portions in the second single-crystalline layer into the third single-crystalline layer.

2. The integrated circuit device of claim 1, wherein the seed layer fills the opening and has a crystalline structure substantially the same as that of the first single-crystalline layer and wherein the transcription-preventing pattern is configured to prevent defective portions in the second single-crystalline layer from being transcribed into overlying layers.

3. The integrated circuit device of claim 1, wherein the transcription-preventing pattern comprises an oxide and/or a nitride.

4. The integrated circuit device of claim 1, wherein the third single-crystalline layer has a thickness greater than a thickness of the second single-crystalline layer.

5. The integrated circuit device of claim 1, further comprising:
a gate pattern on the third single-crystalline layer; and
source/drain regions in the third single-crystalline layer that extend under sidewalls of the gate pattern, wherein the transcription-preventing pattern is positioned adjacent the source/drain regions to limit leakage current from the source/drain regions.

6. The integrated circuit device of claim 1, wherein the insulating layer pattern has a plurality of openings therein that partially expose the first single-crystalline layer and wherein the transcription-preventing pattern covers portions of the second single-crystalline layer substantially at a midpoint between respective ones of the plurality of openings and wherein the defective portions comprise a meeting point of growth fronts that formed the second single-crystalline layer.

7. A semiconductor device, comprising:
a first single-crystalline layer;
a first insulating layer pattern on the first single-crystalline layer, the first insulating layer pattern having an opening partially exposing the first single-crystalline layer;
a first seed layer filling the opening, the seed layer having a crystalline structure substantially the same as that of the first single-crystalline layer;
a second single-crystalline layer on the first insulating layer pattern and the seed layer, the second single-crystalline layer having a crystalline structure substantially the same as that of the first seed layer;
a third single-crystalline layer arranged over the second single-crystalline layer; and
a first transcription-preventing layer interposed between the second single-crystalline layer and the third single-crystalline layer that prevents defective portions in the second single-crystalline layer from being transcribed into the third single-crystalline layer, wherein the first transcription-preventing layer comprises silicon germanium, silicon carbide and/or silicon germanium carbon.

8. A semiconductor device, comprising:
a first single-crystalline layer;
a first insulating layer pattern on the first single-crystalline layer, the first insulating layer pattern having an opening partially exposing the first single-crystalline layer;
a first seed layer filling the opening, the seed layer having a crystalline structure substantially the same as that of the first single-crystalline layer;
a second single-crystalline layer on the first insulating layer pattern and the seed layer, the second single-crystalline layer having a crystalline structure substantially the same as that of the first seed layer;
a third single-crystalline layer arranged over the second single-crystalline layer;
a first transcription-preventing layer interposed between the second single-crystalline layer and the third single-crystalline layer that prevents defective portions in the second single-crystalline layer from being transcribed into the third single-crystalline layer; and
a second insulating layer to an m-th insulating layer, a second seed layer to an m-th seed layer, wherein m is a natural number no less than 3, a fourth single-crystalline layer to an n-th single-crystalline layer, wherein n is an even number no less than 6, a second transcription-preventing layer to an o-th transcription-preventing layer, wherein o is a natural number no less than 3, and a fifth crystalline layer to a p-th crystalline layer, wherein p is an odd number no less than 7 sequentially and repeatedly formed on the third single-crystalline layer,
wherein the second insulating layer to the m-th insulating layer are substantially the same as the first insulating layer, the second seed layer to the m-th seed layer are substantially the same as the first seed layer, the fourth single-crystalline layer to the n-th single-crystalline layer are substantially the same as the second single-crystalline layer, the second transcription-preventing layer to the o-th transcription-preventing layer are substantially the same as the first transcription-preventing layer, and the fifth crystalline layer to the p-th crystalline layer are substantially the same as the third single-crystalline layer.

9. The semiconductor device of claim 8, wherein the second transcription-preventing layer to the o-th transcription-preventing layer comprise silicon germanium, silicon carbide and/or silicon germanium carbon.

10. The semiconductor device of claim 8, wherein each of the fifth crystalline layer to the p-th crystalline layer has a thickness greater than that of the fourth single-crystalline layer to the n-th single-crystalline layer.

* * * * *